(12) United States Patent
Shirai

(10) Patent No.: US 8,308,440 B2
(45) Date of Patent: Nov. 13, 2012

(54) VACUUM PROCESSING APPARATUS, METHOD OF CONTROLLING VACUUM PROCESSING APPARATUS, DEVICE MANUFACTURING METHOD, AND STORAGE MEDIUM

(75) Inventor: Yasuyuki Shirai, Fuchu (JP)

(73) Assignee: Canon Anelva Corporation, Kawasaki-shi (JP)

( * ) Notice: Subject to any disclaimer, the term of this patent is extended or adjusted under 35 U.S.C. 154(b) by 656 days.

(21) Appl. No.: 12/403,659

(22) Filed: Mar. 13, 2009

(65) Prior Publication Data
US 2009/0229688 A1 Sep. 17, 2009

(30) Foreign Application Priority Data

Mar. 14, 2008 (JP) ................................. 2008-065850
Feb. 23, 2009 (JP) ................................. 2009-039817

(51) Int. Cl.
*F04B 49/00* (2006.01)

(52) U.S. Cl. ................. 417/28; 137/565.14; 137/565.17; 137/565.23

(58) Field of Classification Search ............. 137/565.23, 137/565.13, 565.14, 565.17; 251/144, 326; 417/23, 26, 28
See application file for complete search history.

(56) References Cited

U.S. PATENT DOCUMENTS

| 1,205,619 | A | * | 11/1916 | Hansen | .......................... | 137/240 |
| 4,261,389 | A | * | 4/1981 | Hager et al. | ............. | 137/625.38 |
| 2001/0040230 | A1 | * | 11/2001 | Yoo et al. | ...................... | 251/326 |
| 2002/0104568 | A1 | * | 8/2002 | Cronimus | ..................... | 137/551 |

FOREIGN PATENT DOCUMENTS

| JP | 04-185984 A | 7/1992 |
| JP | 06-033876 A | 2/1994 |
| JP | 08-042737 A | 2/1996 |
| JP | 2008-042737 | 2/2008 |
| KR | 1999-0038643 | 10/1999 |
| KR | 10-2005-0075899 A | 7/2005 |

OTHER PUBLICATIONS

Korean Office Action dated Jan. 20, 2011, in related corresponding Korean Patent Application No. 10-2009-0021687.
Korean Notice of Allowance dated Oct. 21, 2011, in related corresponding Korean Patent Application No. 10-2009-0021687.

* cited by examiner

*Primary Examiner* — John Rivell
*Assistant Examiner* — Ian Paquette
(74) *Attorney, Agent, or Firm* — Fitzpatrick, Cella, Harper & Scinto

(57) ABSTRACT

A vacuum processing apparatus having a vacuum chamber includes a gate valve arranged in the vacuum chamber and including a valve body which moves in a direction relative to an exhaust port of the vacuum chamber to open/close the exhaust port, and a driving unit configured to move the valve body, a connecting portion having one end connected to the exhaust port of the vacuum chamber and formed in a direction inclined from a moving direction of the valve body, and an exhaust pump connected to an opposite end of the connecting portion and capable of evacuating an interior of the connecting portion. The driving unit includes (i) a rod serving as a driving shaft which drives the valve body in a direction to close the exhaust port or a direction to open the exhaust port, and (ii) a cylinder driving the rod, and the rod extends parallel to a moving direction of the valve body and supports the valve body at one end. In addition, the connecting portion is connected to the exhaust port of the vacuum chamber in a direction inclined at a predetermined angle from an axial direction of the rod, and the cylinder is arranged outside the connecting portion and connected to an opposite end of the rod.

16 Claims, 3 Drawing Sheets

VACUUM PROCESSING APPARATUS, METHOD OF CONTROLLING VACUUM PROCESSING APPARATUS, DEVICE MANUFACTURING METHOD, AND STORAGE MEDIUM

BACKGROUND OF THE INVENTION

1. Field of the Invention

The present invention relates to a vacuum processing apparatus which includes a gate valve for opening/closing the exhaust port of a vacuum chamber and exhausts the interior of the vacuum chamber by an exhaust pump, a method of controlling the vacuum processing apparatus, a device manufacturing method, and a storage medium.

2. Description of the Related Art

As a conventional vacuum processing apparatus, for example, an arrangement as shown in FIG. 3 is known (see Japanese Patent Laid-Open No. 08-42737). As shown in FIG. 3, this vacuum processing apparatus 101 includes a vacuum chamber 105 provided with an exhaust port 110 and an exhaust pump 106 communicating with the exhaust port 110 of the vacuum chamber 105. A gate valve 107 having a valve body 111 which opens/closes the exhaust port 110 is arranged near the exhaust port 110 of the vacuum chamber 105.

The gate valve 107 includes the valve body 111 arranged in the vacuum chamber 105, and a driving portion 112 to drive the valve body 111. The driving portion 112 has a set of rods 113a and 113b and a set of cylinders 114a and 114b. The rods 113a and 113b drive the valve body 111 in a direction (an arrow b in FIG. 3) to come close to the exhaust port 110 and a direction (an arrow a in FIG. 3) to separate from the exhaust port 110. The cylinders 114a and 114b drive the rods 113a and 113b, respectively.

The rods 113a and 113b extend parallel to the moving direction of the valve body 111 and each support the valve body 111 at its one end. The set of cylinders 114a and 114b are arranged at positions opposing each other across the exhaust port 110. The other end of each of the rods 113a and 113b is connected to the corresponding one of the cylinders 114a and 114b. The driving portion 112 is provided with bellows 118a and 118b which cover the outer surfaces of the rods 113a and 113b, respectively, to hermetically seal the rods 113a and 113b and cylinders 114a and 114b in a vacuum state.

The exhaust port 110 of the vacuum chamber 105 is provided with a seal portion 116. Upon being abutted by the valve body 111, the seal portion 116 hermetically closes the interior of the vacuum chamber 105. A variable orifice 123 may be mounted between the exhaust port 110 and exhaust pump 106. The size of the outer shape of the valve body 111 is larger than the opening area of the exhaust port 110 of the vacuum chamber 105. The valve body 111 is supported to be movable by the driving portion 112 between a closing position P11 for closing the exhaust port 110 and an opening position P12 for opening the exhaust port 110. The vacuum chamber 105 is further provided with another exhaust port 120 which communicates with an auxiliary pump (not shown).

During evacuation of the vacuum chamber 105, the valve body 111 is moved to the opening position P12 for opening the exhaust port 110. While evacuation of the vacuum chamber 105 is stopped, the valve body 111 is moved to the closing position P11 for closing the exhaust port 110.

In the conventional vacuum processing apparatus described above, however, when the exhaust pump and driving portion are to be set on the same side outside the vacuum chamber, one set of cylinders and one set of rods must be arranged each on the two sides across the exhaust pump. For this reason, in the conventional vacuum processing apparatus, in order to support the valve body 111, a plurality of installation spaces to arrange two rods 113a and 113b or more are necessary. Namely, the conventional vacuum processing apparatus tends to be bulky as a whole, which is inconvenient.

SUMMARY OF THE INVENTION

It is therefore an object of the present invention to solve the above problem and, more particularly, to provide a vacuum processing apparatus in which the necessary space to install an exhaust pump and a driving portion for a gate valve is reduced, thus making the entire apparatus compact.

According to one aspect of the present invention, there is provided a vacuum processing apparatus including a vacuum chamber, comprising:

a gate valve arranged in the vacuum chamber and including a valve body which moves in a direction to come close to and separate from an exhaust port of the vacuum chamber to open/close the exhaust port, and driving means for moving the valve body;

a connecting portion having one end connected to the exhaust port of the vacuum chamber and formed in a direction inclined from a moving direction of the valve body; and an exhaust pump connected to the other end of the connecting portion and capable of evacuating an interior of the connecting portion, wherein the gate valve is arranged between the one end and the other end of the connecting portion, and the gate valve is arranged outside the connecting portion.

According to another aspect of the present invention, there is provided a vacuum processing apparatus including a vacuum chamber, comprising:

a gate valve arranged in the vacuum chamber and including a valve body which moves in a direction to come close to and separate from an exhaust port of the vacuum chamber to open/close the exhaust port, and driving means for moving the valve body;

a first connecting portion formed in a direction inclined from a moving direction of the valve body;

a second connecting portion having one end connected to the exhaust port of the vacuum chamber and other end connected to one end of the first connecting portion and formed in a direction parallel to the moving direction of the valve body; and an exhaust pump connected to the other end of the first connecting portion and capable of evacuating an interior of the first connecting portion and an interior of the second connecting portion, wherein the gate valve is arranged between the one end and the other end of the second connecting portion, and the gate valve is arranged outside the second connecting portion.

According to still another aspect of the present invention, there is provided a method of controlling a vacuum processing apparatus including a vacuum chamber and a gate valve which is arranged in the vacuum chamber and includes a valve body, which moves in a direction to come close to and separate from an exhaust port of the vacuum chamber to open/close the exhaust port, and driving means for moving the valve body, the method comprising:

an exhausting step of driving an exhaust pump connected to the exhaust port of the vacuum chamber through a connecting portion formed in a direction inclined from a moving direction of the valve body, thus evacuating an interior of the connecting portion; and a moving step of moving the valve body by driving the driving means of the gate valve after the interior of the connecting portion is exhausted in the exhausting step.

According to yet another aspect of the present invention, there is provided a device manufacturing method comprising a step of processing a substrate using a vacuum processing apparatus according to one aspect of the present invention.

According to still yet another aspect of the present invention, there is provided a device manufacturing method comprising a step of processing a substrate using a vacuum processing apparatus according to another aspect of the present invention.

According to yet still another aspect of the present invention, there is provided a computer-readable storage medium which stores a program that causes a computer to execute a method of controlling a vacuum processing apparatus according to still another aspect of the present invention.

According to the present invention, the space outside the vacuum chamber necessary to install the vacuum pump and the driving portion for the gate valve can be reduced, so that the entire space can be reduced. Therefore, according to the present invention, the entire vacuum processing apparatus can be made compact.

Further features of the present invention will become apparent from the following description of exemplary embodiments with reference to the attached drawings.

BRIEF DESCRIPTION OF THE DRAWINGS

FIGS. 1-1A and 1B are views showing a vacuum processing apparatus according to the first embodiment, in which FIG. 1-1A is a sectional view and FIG. 1-1B is a partial side view;

FIGS. 2-2A and 2B are views showing a vacuum processing apparatus according to the second embodiment, in which FIG. 2-2A is a sectional view and FIG. 2-2B is a partial side view.

DESCRIPTION OF THE EMBODIMENTS

The embodiments of the present invention will be described below with reference to the accompanying drawings.

First Embodiment

Figure 1:
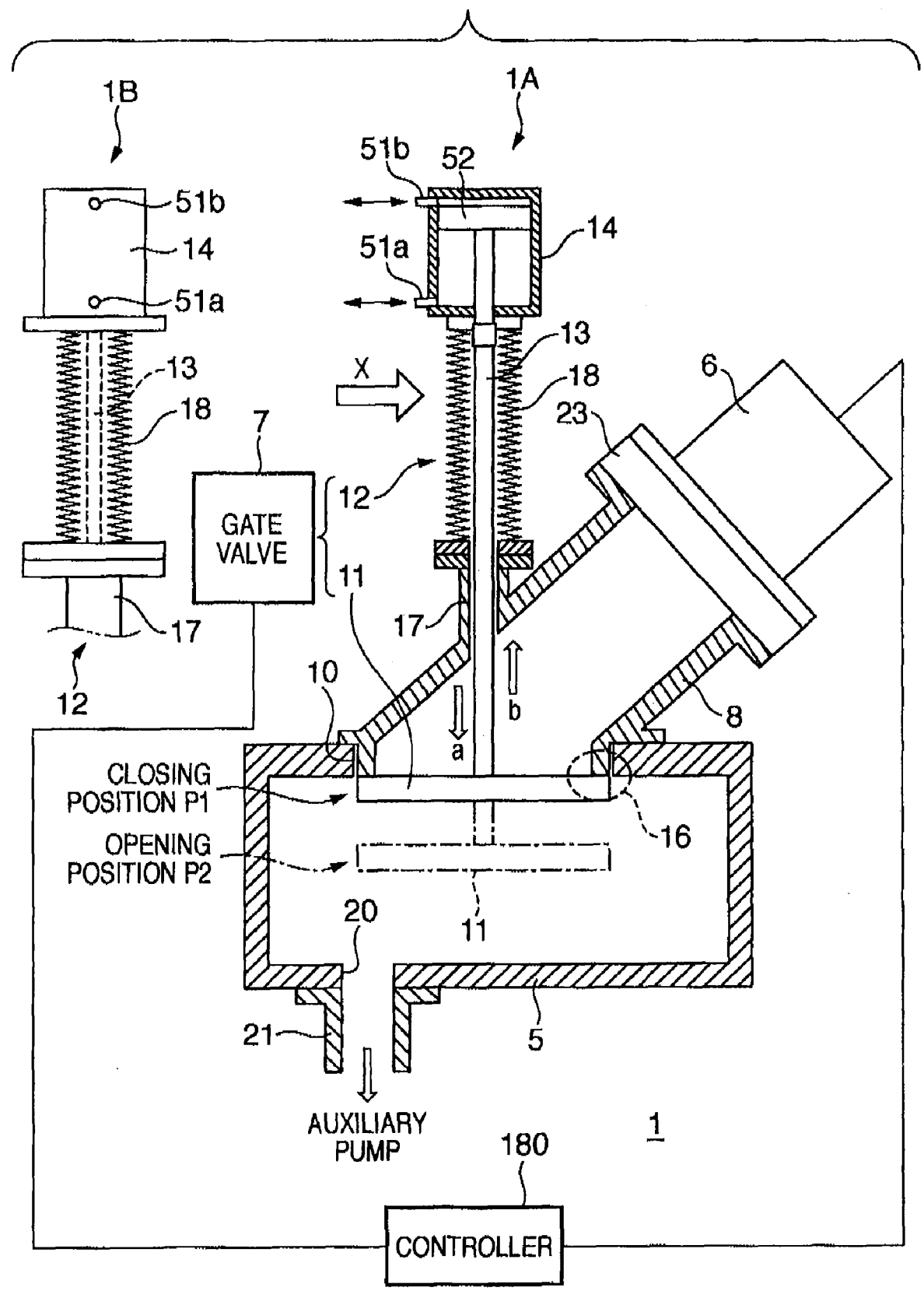

FIG. 1-1A is a sectional view of a vacuum processing apparatus according to the first embodiment, and FIG. 1-1B is a partial side view of the vacuum processing apparatus according to the first embodiment which is seen from the direction of an arrow X in FIG. 1-1A.

As shown in FIG. 1-1A, a vacuum processing apparatus 1 of the first embodiment includes a vacuum chamber 5, an exhaust pump 6 communicating with an exhaust port 10 of the vacuum chamber 5, and a gate valve 7 having a valve body 11 which opens/closes the exhaust port 10. A controller 180 controls the operation of the vacuum processing apparatus.

The vacuum chamber 5 is connected to a connecting portion 8 in a direction inclined at a predetermined angle from the axial direction of a rod 13. One end of the connecting portion 8 is inserted in the exhaust port 10. The other end of the connecting portion 8 is connected to the exhaust pump 6. The vacuum chamber 5 is provided with another auxiliary exhaust port 20. The exhaust port 20 is connected to an auxiliary pump (not shown) through a connecting portion 21. The vacuum chamber 5 thus communicates with the auxiliary pump through the connecting portion 21.

The gate valve 7 includes the valve body 11 arranged in the vacuum chamber 5 and a driving portion 12 to drive the valve body 11. The driving portion 12 has the rod 13 and cylinder 14. The rod 13 serves as a driving shaft which drives the valve body 11 in a direction (an arrow b in FIG. 1-1A) to come close to the exhaust port 10 and a direction (an arrow a in FIG. 1-1A) to separate from the exhaust port 10. The cylinder 14 drives the rod 13. The rod 13 extends parallel to the moving direction of the valve body 11 and supports the valve body 11 at its one end. The cylinder 14 is arranged outside the connecting portion 8 and connected to the other end of the rod 13. The connecting portion 8 is integrally formed with an axial support 17 which supports the rod 13 to be movable in the directions of arrows a and b. Hence, the valve body 11 is supported to be movable by the driving portion 12 between a closing position P1 for closing the exhaust port 10 and an opening position P2 for opening the exhaust port 10.

The size of the outer shape of the valve body 11 is larger than the opening area of one end of the connecting portion 8 which is inserted in and connected to the exhaust port 10. When the valve body 11 is moved to the closing position P1, it can close one end of the connecting portion 8. The size of the outer shape of the valve body 11 is smaller than the opening area of the exhaust port 10 of the vacuum chamber 5. One end of the connecting portion 8 is provided with a seal portion 16 to hermetically close the interior of the vacuum chamber 5 with the valve body 11. Thus, when the valve body 11 is moved to the closing position P1, it abuts against the end face of one end of the connecting portion 8 through the seal portion 16, so it can hermetically close the interior of the vacuum chamber 5.

As shown in FIGS. 1-1A and 1B, the driving portion 12 is provided with a bellows 18 which covers the outer surface of the rod 13 so as to hermetically seal the rod 13 and cylinder 14 in a vacuum state. One end of the bellows 18 is fixed to the axial support 17, and the other end thereof is fixed to the bearing portion of the cylinder 14. The hermetical closing mechanism to hermetically close the rod 13 and cylinder 14 in the vacuum state is not limited to an arrangement that uses a bellows member such as the bellows 18. Another arrangement that uses, in place of the bellows member, for example, an O-ring (not shown) fitted on the outer surface of the rod 13 may also be employed.

According to this embodiment, the valve body 11, rod 13, cylinder 14, connecting portion 8, and exhaust pump 6 which constitute an exhaust system can be removed from the vacuum chamber 5 comparatively easily without dismantling them all.

The cylinder 14 is provided with ports 51a and 51b and a flange 52. A working medium to operate the cylinder 14 is supplied or discharged through the ports 51a and 51b. As the working medium is supplied to the cylinder 14 through the port 51a, part of the working medium which is supplied to the lower surface side of the flange 52 pushes up the flange 52. As the flange 52 moves upward, part of the working medium which is located on the upper surface side of the flange 52 is discharged through the port 51b. The rod 13 is connected to the flange 52, and moves upward as the flange 52 moves upward. As the rod 13 moves upward, the valve body 11 connected to the rod 13 moves to reach the closing position P1. In this state, the valve body 11 closes the exhaust port 10 of the vacuum chamber 5.

As the working medium is supplied to the cylinder 14 through the port 51b, part of the working medium which is supplied to the upper surface side of the flange 52 pushes the flange 52 downward. As the flange 52 moves downward, part of the working medium which is located on the lower surface side of the flange 52 is discharged through the port 51a. As the flange 52 moves downward, the rod 13 also moves downward. As the rod 13 moves downward, the valve body 11 connected to the rod 13 moves to reach the opening position P2. In this state, the valve body 11 opens the exhaust port 10 of the vacuum chamber 5, and the interior of the vacuum chamber 5 communicates with the exhaust pump 6 through the connecting portion 8.

Assume that with the interior of the connecting portion 8 is being evacuated by the exhaust pump 6, the valve body 11 is at the closing position P1 and the interior of the vacuum chamber 5 is to be pressurized to near atmospheric pressure. Since the valve body 11 is arranged in the vacuum chamber 5, it receives the atmospheric pressure acting on the exhaust port 10. The atmospheric pressure biases that lower surface of the valve body 11 which faces the interior of the vacuum chamber 5. For example, when the valve body 11 is at the opening position P2, biasing by the atmospheric pressure can form part of the driving force to drive the valve body 11. In this case, biasing by the atmospheric pressure does not depend on the driving force that closes the valve body 11 by the cylinder 14. On the upper surface side of the valve body 11 which faces the connecting portion side, the exhaust pump 6 evacuates the interior of the connecting portion 8. Thus, while the valve body 11 moves from the opening position P2 to the closing position P1, the load of pushing up the gas located on the upper surface side of the valve body 11 to move the valve body 11 is reduced. By utilizing the evacuation of the interior of the connecting portion 8 by the exhaust pump 6 and biasing by the atmospheric pressure, the cylinder 14 can be made into a comparatively small size having only a driving force necessary to move the valve body 11 and rod 13 in the direction of the arrow b when closing the valve body 11. As a result, according to this embodiment, when compared to the conventional arrangement in which the driving portion requires a driving force equal to or higher than the atmospheric pressure acting on the exhaust port, the cylinder 14 of the driving portion 12 can be made compact.

As shown in FIG. 1-1A, where necessary, a variable orifice 23 may be arranged between the exhaust pump 6 and connecting portion 8.

Concerning the vacuum processing apparatus 1 according to this embodiment having the above arrangement, the operation of evacuating the interior of the vacuum chamber 5 will be described.

When evacuating the interior of the vacuum chamber 5, the controller 180 drives the exhaust pump 6 to evacuate the interior of the connecting portion 8. At this time, the valve body 11 may be located on either the closing position P1 or the opening position P2. A sensor (not shown) serving as a detector to detect the position of the valve body 11 detects the position of the valve body 11. The detection output is input to the controller 180.

First, when restoring, namely, opening the interior of only the vacuum chamber 5 to near the atmospheric pressure, under the control of the controller 180, the cylinder 14 is driven, so that the valve body 11 is moved in the direction of the arrow b and is stopped at the closing position P1. After that, the interior of only the vacuum chamber 5 is open to near the atmospheric pressure.

Successively, when the interior of the vacuum chamber 5 is to be evacuated to a vacuum, the controller 180 drives the auxiliary pump (not shown) to evacuate the interior of the vacuum chamber 5. After that, the cylinder 14 moves the rod 13 in the direction of the arrow a so the valve body 11 is stopped at the opening position P2.

According to the vacuum processing apparatus 1 of this embodiment, the connecting portion 8 extends in a direction inclined from the moving direction of the valve body 11, and the rod 13 of the driving portion 12 extends in the moving direction of the valve body 11. With this arrangement, the space outside the vacuum chamber 5 which is necessary to install the exhaust pump 6 and the cylinder 14 of the driving portion 12 for the gate valve 7 can be reduced, thus reducing the space. Hence, with the vacuum processing apparatus 1, the entire apparatus can be made compact.

According to this embodiment, the valve body 11 is smaller than the exhaust port 10 of the vacuum chamber 5, and the seal portion 16 is formed at the end of the connecting portion 8. Thus, an exhaust system including the gate valve 7 and exhaust pump 6 can be removed and attached in an assembled state from and to the vacuum chamber 5. More specifically, the gate valve 7 can be removed from the vacuum chamber 5 comparatively easily without completely dismantling the gate valve 7 and exhaust pump 6. Therefore, with the vacuum processing apparatus 1, the working efficiency in maintaining, for example, the driving portion 12 of the gate valve 7 can be improved.

Also, according to this embodiment, as the valve body 11 is arranged in the vacuum chamber 5, the cylinder 14 of the driving portion 12 can be made compact.

Second Embodiment

In the first embodiment described above, an arrangement is employed in which the exhaust pump 6 communicates with the vacuum chamber 5 through the connecting portion 8. Alternatively, an arrangement may be employed in which another connecting portion is further arranged between the vacuum chamber 5 and connecting portion 8.

Figure 2:
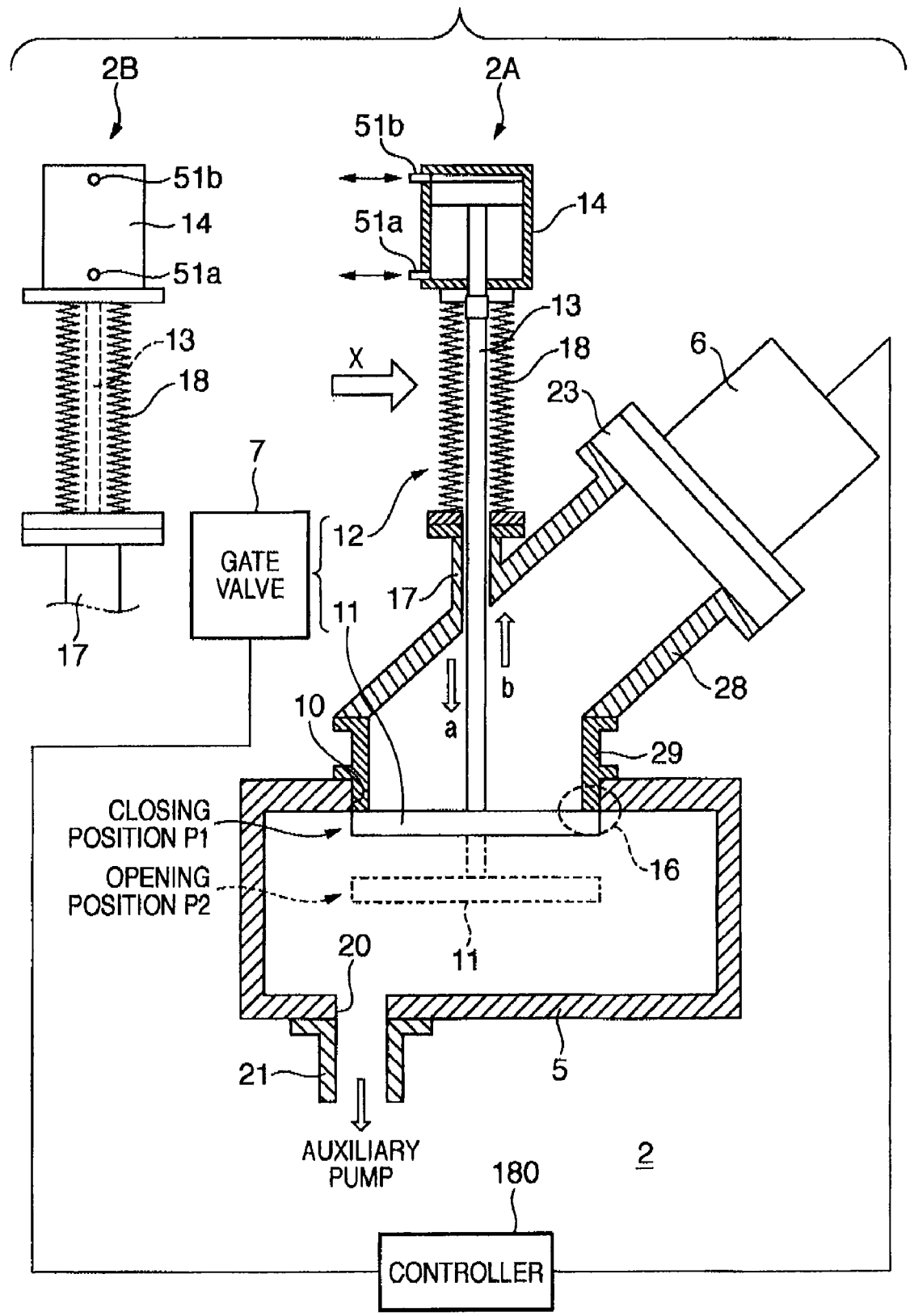
Figure 3:
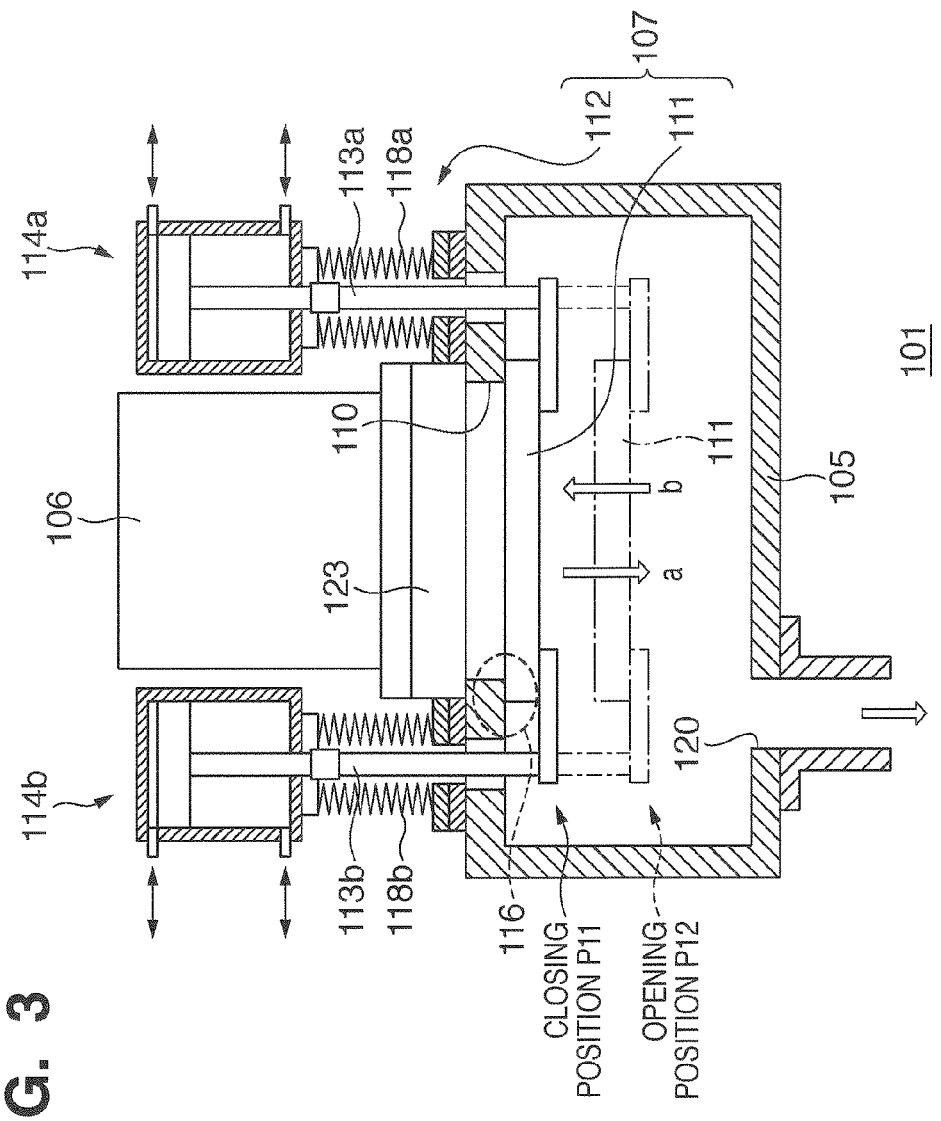
FIG. 3 is a sectional view showing a conventional vacuum processing apparatus.

FIGS. 2-2A and 2B are sectional views of a vacuum processing apparatus according to the second embodiment. In the second embodiment, the constituent members that function in the same manner as those of the vacuum processing apparatus of the first embodiment are denoted by the same reference numerals, and a repetitive description will be omitted.

As shown in FIGS. 2-2A and 2B, a vacuum processing apparatus 2 of the second embodiment includes a first connecting portion 28 corresponding to the connecting portion 8 in the first embodiment. One end of the first connecting portion 28 is connected to a second connecting portion 29. The other end of the first connecting portion 28 is connected to an exhaust pump 6. The second connecting portion 29 forms a straight pipe. One end of the second connecting portion 29 is inserted in and connected to an exhaust port 10 of a vacuum chamber 5. The other end of the second connecting portion 29 is connected and fixed to the first connecting portion 28.

The size of the outer shape of a valve body 11 of a gate valve 7 is larger than the opening area of one end of the second connecting portion 29 which is inserted in and connected to the exhaust port 10. When the valve body 11 moves to a closing position P1, it can close one end of the second connecting portion 29. The size of the outer shape of the valve body 11 is smaller than the opening area of the exhaust port 10 of the vacuum chamber 5. One end of the second connecting portion 29 is provided with a seal portion 16 to hermetically seal the interior of the vacuum chamber 5 with the valve body 11. Thus, when the valve body 11 is moved to the closing position P1, it abuts against the end face of one end of the second connecting portion 29 through the seal portion 16, thus hermetically closing the interior of the vacuum chamber 5.

The second embodiment may also employ an arrangement in which a variable orifice 23 is arranged between the exhaust pump 6 and first connecting portion 28, in the same manner as the first embodiment.

The operation of the vacuum processing apparatus 2 of the second embodiment is the same as that of the vacuum processing apparatus 1 of the first embodiment described above, and accordingly a repetitive description will be omitted.

In the vacuum processing apparatus 2 of this embodiment, the second connecting portion 29 is formed between the exhaust port 10 of the vacuum chamber 5 and the first connecting portion 28 which extends in a direction inclined from the moving direction of the valve body 11. With this arrangement, the position of the first connecting portion 28 can be shifted in the moving direction of the valve body 11 with respect to the exhaust port 10 of the vacuum chamber 5. A space can thus be ensured between the vacuum chamber 5 and exhaust pump 6. In other words, because the vacuum processing apparatus 2 includes the second connecting portion 29, a desired space can be ensured near the exhaust port 10.

(Device Manufacturing Method)

The vacuum processing apparatus according to each of the first and second embodiments can be suitably employed in substrate processing in a semiconductor manufacturing process or liquid crystal manufacturing process. A device manufacturing method of manufacturing a semiconductor device or liquid crystal device (to be merely referred to as a "device" hereinafter) has a process for processing a substrate using a vacuum processing apparatus according to the first or second embodiment.

Other Embodiments

The object of the present invention is also achieved when a computer-readable storage medium which records a software program for implementing the functions of the above-described embodiments is supplied to a system or apparatus. The object of the present invention is also achieved when the computer (or the CPU or MPU) of the system or apparatus reads out and executes the program stored in the storage medium.

In this case, the program itself which is read out from the storage medium implements the functions of the embodiments described above, and the storage medium which stores this program constitutes the present invention.

The storage medium for supplying the program can include, for example, a flexible disk, hard disk, optical disk, magnetooptical disk, CD-ROM, CD-R, nonvolatile memory card, and ROM.

The functions of the embodiments described above are implemented when the computer executes the readout program. This naturally includes a case in which an OS (Operating System) or the like running on the computer performs some or all of actual processes on the basis of the instructions of the program, thus implementing the embodiments described above.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-065850 filed Mar. 14, 2008, Japanese Patent Application No. 2009-039817 filed Feb. 23, 2009, which are hereby incorporated by reference herein in their entirety.

What is claimed is:

1. A vacuum processing apparatus including a vacuum chamber, comprising:
   a gate valve arranged in said vacuum chamber and including a valve body which moves in a direction relative to an exhaust port of said vacuum chamber to open/close the exhaust port, and a driving unit configured to move the valve body;
   a connecting portion having one end connected to the exhaust port of said vacuum chamber and formed in a direction inclined from a moving direction of said valve body;
   an exhaust pump connected to an opposite end of said connecting portion and capable of evacuating an interior of said connecting portion;
   a controller configured to control said exhaust pump and said driving unit; and
   a sensor configured to detect a position of said valve body and input the position to said controller,
   wherein said driving unit includes (i) a rod serving as a driving shaft which drives said valve body in a direction to close the exhaust port or a direction to open the exhaust port, and (ii) a cylinder driving said rod,
   said rod extends parallel to a moving direction of said valve body and supports said valve body at one end of said rod,
   said connecting portion is connected to the exhaust port of said vacuum chamber in a direction inclined at a predetermined angle from an axial direction of said rod, and
   said cylinder is arranged outside the connecting portion and connected to an opposite end of said rod,
   said controller drives said exhaust pump to evacuate an interior of said connecting portion,
   said controller drives said driving unit to move said valve body based on the position detected by said sensor, and
   an interior of said vacuum chamber is opened from a vacuum to near an atmospheric pressure.

2. The apparatus according to claim 1, wherein said vacuum chamber is provided with an auxiliary exhaust port, and the auxiliary exhaust port is connected to an auxiliary pump through an auxiliary connecting portion,
   when the interior of said vacuum chamber is opened from the vacuum to near the atmospheric pressure, said valve body is moved to a closing position for closing the exhaust port,
   when the interior of said vacuum chamber is evacuated from near the atmospheric pressure to the vacuum, said controller drives said auxiliary pump to evacuate the interior of said vacuum chamber, and
   said valve body is moved from the closing position to an opening position for opening the exhaust port by driving said driving unit in accordance with controlling of said controller.

3. The apparatus according to claim 1, wherein a single drive unit is provided to move the valve body.

4. The apparatus according to claim 1, wherein said controller drives said driving unit so that said valve body is moved to a closing position for closing the exhaust port.

5. The apparatus according to claim 1, wherein said valve body is formed to be larger than an opening area of said one end of said connecting portion.

6. The apparatus according to claim 5,
   wherein said valve body is formed to be smaller than an opening area of the exhaust port of said vacuum chamber, and said one end of said connecting portion is provided with a seal portion which comes into contact with said valve body and maintains a hermetic state formed in said vacuum chamber.

7. A vacuum processing apparatus including a vacuum chamber, comprising:
a gate valve arranged in said vacuum chamber and including a valve body which moves in a direction relative to an exhaust port of said vacuum chamber to open/close the exhaust port, and a driving unit configured to move the valve body;
a first connecting portion formed in a direction inclined from a moving direction of said valve body;
a second connecting portion having one end connected to the exhaust port of said vacuum chamber and another end connected to one end of said first connecting portion and formed in a direction parallel to the moving direction of said valve body;
an exhaust pump connected to an opposite end of said first connecting portion and capable of evacuating an interior of said first connecting portion and an interior of said second connecting portion;
a controller configured to control said exhaust pump and said driving unit; and
a sensor configured to detect a position of said valve body and input the position to said controller,
wherein said driving unit includes (i) a rod serving as a driving shaft which drives said valve body in a direction to close the exhaust port or a direction to separate from the exhaust port, and (ii) a cylinder driving said rod,
said rod extends parallel to a moving direction of said valve body and supports said valve body at one end of said rod,
said first connecting portion is connected to the one end of said second connecting portion in a direction inclined at a predetermined angle from an axial direction of said rod, and
said cylinder is arranged outside said first connecting portion and connected to an opposite end of said rod,
said controller drives said exhaust pump to evacuate an interior of said first connecting portion and an interior of said second connecting portion,
said controller drives said driving unit to move said valve body based on the position detected by said sensor, and
an interior of said vacuum chamber is opened from a vacuum to near an atmospheric pressure.

8. The apparatus according to claim 7, wherein said vacuum chamber is provided with an auxiliary exhaust port, and the auxiliary exhaust port is connected to an auxiliary pump through an auxiliary connecting portion,
when the interior of said vacuum chamber is opened from the vacuum to near the atmospheric pressure, said valve body is moved to a closing position for closing the exhaust port,
when the interior of said vacuum chamber is evacuated from near the atmospheric pressure to the vacuum, said controller drives said auxiliary pump to evacuate the interior of said vacuum chamber, and
said controller drives said driving unit to move said valve body based on the position detected by said sensor, and
said valve body is moved from the closing position to an opening position for opening the exhaust port by driving said driving unit in accordance with controlling of said controller.

9. The apparatus according to claim 7, wherein a single drive unit is provided to move the valve body.

10. The apparatus according to claim 7, wherein said controller drives said driving unit so that said valve body is moved to a closing position for closing the exhaust port.

11. The apparatus according to claim 7, wherein said valve body is formed to be larger than an opening area of said one end of said second connecting portion.

12. The apparatus according to claim 11,
wherein said valve body is formed to be smaller than an opening area of the exhaust port of said vacuum chamber, and
said one end of said second connecting portion is provided with a seal portion which comes into contact with said valve body and maintains a hermetic state formed in said vacuum chamber.

13. A method of controlling a vacuum processing apparatus including a vacuum chamber and a gate valve which is arranged in the vacuum chamber and includes a valve body, which moves in a direction relative to an exhaust port of the vacuum chamber to open/close the exhaust port, and a driving unit configured to move the valve body, a connecting portion having one end connected to the exhaust port of the vacuum chamber and formed in a direction inclined from a moving direction of the valve body, an exhaust pump connected to an opposite end of the connecting portion and capable of evacuating an interior of the connecting portion, a controller configured to control the exhaust pump and the driving unit; and a sensor configured to detect a position of the valve body and input the position to the controller, wherein the driving unit includes (i) a rod serving as a driving shaft which drives the valve body in a direction to close the exhaust port or a direction to open the exhaust port, and (ii) a cylinder driving the rod,
the rod extends parallel to a moving direction of the valve body and supports the valve body at one end of the rod,
the connecting portion is connected to the exhaust port of the vacuum chamber in a direction inclined at a predetermined angle from an axial direction of the rod, and
the cylinder is arranged outside the connecting portion and connected to an opposite end of the rod, the method comprising:
an evacuation step of evacuating an interior of the connecting portion by driving the exhaust pump by the controller;
a detection step of detecting the position of the valve body by the sensor and inputting the position to the controller;
a moving step of moving the valve body by driving the driving unit in accordance with controlling of the controller based on the position detected in the detection step; and
an opening step of opening an interior of the vacuum chamber from a vacuum to near an atmospheric pressure.

14. The method according to claim 13, wherein the connecting portion includes a first connecting portion formed in a direction inclined from a moving direction of the valve body and a second connecting portion having one end connected to the exhaust port of the vacuum chamber and another end connected to one end of the first connecting portion and formed in a direction parallel to the moving direction of the valve body,
wherein the first connecting portion is connected to the one end of the second connecting portion in a direction inclined at a predetermined angle from an axial direction of the rod.

15. The method according to claim 13, wherein the vacuum chamber is provided with an auxiliary exhaust port, and the auxiliary exhaust port is connected to an auxiliary pump through an auxiliary connecting portion, when the interior of the vacuum chamber is opened from the vacuum to near the atmospheric pressure, the valve body is moved to a closing position for closing the exhaust port, the method further comprising:

a driving step of driving the auxiliary pump by the controller, when the interior of the vacuum chamber is evacuated to a vacuum;

a second detection step of detecting the position of the valve body and inputting the position to the controller; and a second moving step of moving the valve body from the closing position to an opening position for opening the exhaust port by driving the driving unit in accordance with controlling of the controller.

16. The method according to claim 13, wherein the controller drives, in the moving step, the driving unit so that the valve body is moved to a closing position for closing the exhaust port.

* * * * *